(12) United States Patent
Bu

(10) Patent No.: US 11,288,892 B2
(45) Date of Patent: Mar. 29, 2022

(54) DISPLAY PANEL AND DISPLAY DEVICE

(71) Applicant: Wuhan China Star Optoelectronics Technology Co., Ltd., Wuhan (CN)

(72) Inventor: Huanhuan Bu, Wuhan (CN)

(73) Assignee: Wuhan China Star Optoelectronics Technology Co., Ltd., Wuhan (CN)

(*) Notice: Subject to any disclaimer, the term of this patent is extended or adjusted under 35 U.S.C. 154(b) by 163 days.

(21) Appl. No.: 16/771,765

(22) PCT Filed: Nov. 11, 2019

(86) PCT No.: PCT/CN2019/116976
§ 371 (c)(1),
(2) Date: Jun. 11, 2020

(87) PCT Pub. No.: WO2021/056713
PCT Pub. Date: Apr. 1, 2021

(65) Prior Publication Data
US 2021/0406500 A1   Dec. 30, 2021

(30) Foreign Application Priority Data

Sep. 27, 2019 (CN) .......................... 201910925459.5

(51) Int. Cl.
| G06K 9/00 | (2022.01) |
| G06V 40/13 | (2022.01) |
| G02F 1/1333 | (2006.01) |
| G02F 1/1335 | (2006.01) |
| H01L 27/32 | (2006.01) |
| H01L 51/52 | (2006.01) |

(Continued)

(52) U.S. Cl.
CPC ...... *G06V 40/1306* (2022.01); *G02F 1/13338* (2013.01); *G02F 1/133514* (2013.01); *G02F 1/133528* (2013.01); *G06F 3/017* (2013.01); *H01L 27/322* (2013.01); *H01L 27/323* (2013.01); *H01L 41/18* (2013.01); *H01L 51/5293* (2013.01)

(58) Field of Classification Search
CPC ............ G06V 40/1306; G02F 1/13338; G02F 1/133514; G02F 1/133528; H01L 27/322; H01L 27/323; H01L 51/5293; G06F 3/017
See application file for complete search history.

(56) References Cited

U.S. PATENT DOCUMENTS

| 5,515,738 A | 5/1996 | Tamori |
| 2020/0372231 A1* | 11/2020 | Liu .......................... G06F 3/017 |

FOREIGN PATENT DOCUMENTS

| CN | 109244108 | 1/2019 |
| CN | 110134188 | 8/2019 |

(Continued)

*Primary Examiner* — Abdul-Samad A Adediran

(57) ABSTRACT

The present disclosure provides a display panel and a display device. The display panel includes a touch sensing module. The touch sensing module includes a touch control unit, a fingerprint sensing module, a vibrating acoustical unit, and a common electrode. The common electrode covers all the above-mentioned and time-divisionally transmits a touch control signal, a fingerprint sensing signal, and a vibrating acoustical signal. Therefore, sound on display functions and fingerprint recognition functions are achieved and holes on the front surface of the display panel are no longer required, which helps increase screen ratio.

20 Claims, 3 Drawing Sheets

(51) Int. Cl.
*G06F 3/01* (2006.01)
*H01L 41/18* (2006.01)

(56) References Cited

FOREIGN PATENT DOCUMENTS

| | | |
|---|---|---|
| CN | 110210435 | 9/2019 |
| JP | 2557796 | 11/1996 |

* cited by examiner

DISPLAY PANEL AND DISPLAY DEVICE

RELATED APPLICATIONS

This application is a National Phase of PCT Patent Application No. PCT/CN/2019/116976 having International filing date of Nov. 11, 2019, which claims the benefit of priority of Chinese Patent Application No. 201910925459.5 filed on Sep. 27, 2019. The contents of the above applications are all incorporated by reference as if fully set forth herein in their entirety.

FIELD AND BACKGROUND OF THE INVENTION

The present disclosure relates to the field of display technologies, more particularly, to a display panel and a display device.

With the technology development of terminals, smartphones started using sound on display technology. The so-called sound on display smartphones use world leading sound on display technology, piezo drive technology, which can perfectly integrate handset functions with high definition screen of smartphones. Thus, sound holes for speakers are no longer required on the front of smartphones. When the piezoelectric is powered on for operation, touch panel of the smartphones vibrates accordingly, thereby vibrating air to generate sounds.

TECHNICAL PROBLEMS

Current fingerprint recognition technologies include optical fingerprint recognition, capacitive fingerprint recognition, and ultrasonic fingerprint recognition. The ultrasonic fingerprint recognition has advantages such as high recognition accuracy and can sense the dermis of fingers directly without being affected by oil, dirt, and water. The common present terminal devices, such as mobile devices, can implement fingerprint recognition. Common implementations of fingerprint recognition include: 1). integrating capacitive, optical, and ultrasonic fingerprint identifications under the home button, 2). integrating capacitance, optics, ultrasonic and other fingerprint identifications to the screens. However, among the above technologies, the sound on display and fingerprint recognition are independent modules from the terminal devices which occupying more space in the display panel, which is unfavorable for increasing the screen ratio of the display panel.

Therefore, the present display panels have a problem of lower screen ratio because sound on display and fingerprint recognition occupy much space. Hence, a display panel and a display device are required to improve the drawback.

SUMMARY OF THE INVENTION

The present disclosure provides a display panel and a display device for solving problems of lower screen ratio resulted from that the sound on display and fingerprint recognition occupy more space.

An embodiment of the present disclosure provides a display panel comprising a touch sensing module, wherein the touch sensing module comprises:

A touch control unit comprising a touch control signal line;

A fingerprint sensing module comprising a fingerprint sensing circuit and a first piezoelectric layer;

A vibrating acoustical unit comprising a vibrating acoustical circuit and a second piezoelectric layer; and A common electrode, wherein the common electrode covers the touch control unit, the fingerprint sensing module, and the vibrating acoustical unit and are configured to time-divisionally transmit a touch control signal, a fingerprint sensing signal, and a vibrating acoustical signal.

According to the embodiment of the present disclosure, a gap is defined between the fingerprint sensing module and the vibrating acoustical unit, and is filled with sound insulation material for blocking interference between the vibrating acoustical unit and the fingerprint sensing module.

According to the embodiment of the present disclosure, the vibrating acoustical circuit comprises a first electrode disposed on one side of the first piezoelectric layer facing away from the common electrode, a passivation protective layer is disposed between the first electrode and the first piezoelectric layer, and the vibrating acoustical circuit and the fingerprint sensing circuit have a same structure and is disposed in a same layer.

According to the embodiment of the present disclosure, a material of the first electrode is selected from one of Ag, Al, Mo, Au, Cr, Ni, Cu, and Pt, or a combination of more than one of Ag, Al, Mo, Au, Cr, Ni, Cu, and Pt.

According to the embodiment of the present disclosure, the display panel further comprises a color film substrate and an array substrate disposed opposite to each other and a liquid crystal layer disposed between the color film substrate and the array substrate, wherein a polarizer is disposed on one side of the color film substrate facing away from the liquid crystal layer, and the touch sensing module is disposed between the polarizer and the color film substrate.

According to the embodiment of the present disclosure, the display panel further comprises a color film substrate and an array substrate disposed opposite to each other and a liquid crystal layer disposed between the color film substrate and the array substrate, wherein the touch sensing module is disposed on one side of the color film substrate close to the liquid crystal layer.

According to the embodiment of the present disclosure, the display panel further comprises a base substrate, an organic light-emitting diode component layer, and a packaging layer, the touch sensing module is disposed on one side of the packaging layer facing away from the organic light-emitting diode component layer.

According to the embodiment of the present disclosure, a material of the first piezoelectric layer is selected from aluminum nitride, lead zirconate titanate, or polyvinylidene fluoride.

According to the embodiment of the present disclosure, a material of the second piezoelectric layer is piezoelectric ceramics.

An embodiment of the present disclosure provides a display device, comprising a display panel comprising a touch sensing module, wherein the touch sensing module comprising:

A touch control unit comprising a touch control signal line;

A fingerprint sensing module comprising a fingerprint sensing circuit and a first piezoelectric layer;

A vibrating acoustical unit comprising a vibrating acoustical circuit and a second piezoelectric layer; and A common electrode, wherein the common electrode covers the touch control unit, the fingerprint sensing module, and the vibrating acoustical unit and is configured to time-divisionally transmit a touch control signal, a fingerprint sensing signal, and a vibrating acoustical signal.

According to the embodiment of the present disclosure, a gap is defined between the fingerprint sensing module and the vibrating acoustical unit, and is filled with sound insulation material for blocking interference between the vibrating acoustical unit and the fingerprint sensing module.

According to the embodiment of the present disclosure, the vibrating acoustical circuit comprises a first electrode disposed on one side of the a first piezoelectric layer facing away from the common electrode, a passivation protective layer is disposed between the first electrode and the first piezoelectric layer, and the vibrating acoustical circuit and the fingerprint sensing circuit have a same structure and is disposed in a same layer.

According to the embodiment of the present disclosure, a material of the first electrode is selected from one of Ag, Al, Mo, Au, Cr, Ni, Cu, and Pt, or a combination of more than one of Ag, Al, Mo, Au, Cr, Ni, Cu, and Pt.

According to the embodiment of the present disclosure, the display panel further comprises a color film substrate and an array substrate disposed opposite to each other and comprise a liquid crystal layer disposed between the color film substrate and the array substrate, wherein a polarizer is disposed on one side of the color film substrate facing away from the liquid crystal layer, and the touch sensing module is disposed between the polarizer and the color film substrate.

According to the embodiment of the present disclosure, the display panel further comprises a color film substrate and an array substrate disposed opposite to each other and comprise a liquid crystal layer disposed between the color film substrate and the array substrate, wherein the touch sensing module is disposed on one side of the color film substrate close to the liquid crystal layer.

According to the embodiment of the present disclosure, the display panel further comprises a base substrate, an organic light-emitting diode component layer, and a packaging layer, the touch sensing module is disposed on one side of the packaging layer facing away from the organic light-emitting diode component layer.

According to the embodiment of the present disclosure, a material of the first piezoelectric layer is selected from aluminum nitride, lead zirconate titanate, or polyvinylidene fluoride.

According to the embodiment of the present disclosure, a material of the second piezoelectric layer is piezoelectric ceramics.

An embodiment of the present disclosure further provides a display device,

According to the embodiment of the present disclosure, comprising a display panel comprising a touch sensing module, wherein the touch sensing module comprising:

A touch control unit comprising a touch control signal line;

A fingerprint sensing module comprising a fingerprint sensing circuit and a first piezoelectric layer;

A vibrating acoustical unit comprising a vibrating acoustical circuit and a second piezoelectric layer, wherein the vibrating acoustical circuit and the fingerprint sensing circuit have a same structure and is dispose in a same layer, and the vibrating acoustical circuit comprises a first electrode; and A common electrode, wherein the common electrode covers a touch control unit, a fingerprint sensing module, a vibrating acoustical unit and is configured to time-divisionally transmit a touch control signal, a fingerprint sensing signal, and a vibrating acoustical signal, and the first electrode disposed on one side of the a first piezoelectric layer facing away from the common electrode.

According to the embodiment of the present disclosure, a gap is defined between the fingerprint sensing module and the vibrating acoustical unit, and is filled with sound insulation material for blocking interference between the vibrating acoustical unit and the fingerprint sensing module.

Beneficial Effects

The beneficial effects of the present disclosure are: the embodiment of the present disclosure integrates the touch control unit, the fingerprint sensing module, and the vibrating acoustical unit to the touch sensing module of the display panel. The common electrode covers the touch control unit, the fingerprint sensing module, and the vibrating acoustical unit and are configured to time-divisionally transmit the touch control signal, the fingerprint sensing signal, and the vibrating acoustical signal to implement sound screen and fingerprint recognition, thereby saving components of the display panel and the display device and holes on the front surface of the display panel. Thus, risks of dust clogging or dust invasion of the display panel through the handset are reduced, while the screen ratio of the display panel and the display device is increased.

BRIEF DESCRIPTION OF THE SEVERAL VIEWS OF THE DRAWINGS

In order to clarify the technical solutions of embodiments of the present disclosure, drawings required to describe the embodiments are briefly illustrated. Obviously, the mentioned embodiments are only parts of the embodiments instead of all of the embodiments. Other embodiments can be obtained by a skilled person in the art without creative effort fall in the protected scope of the present disclosure.

DESCRIPTION OF SPECIFIC EMBODIMENTS OF THE INVENTION

Figure 1:
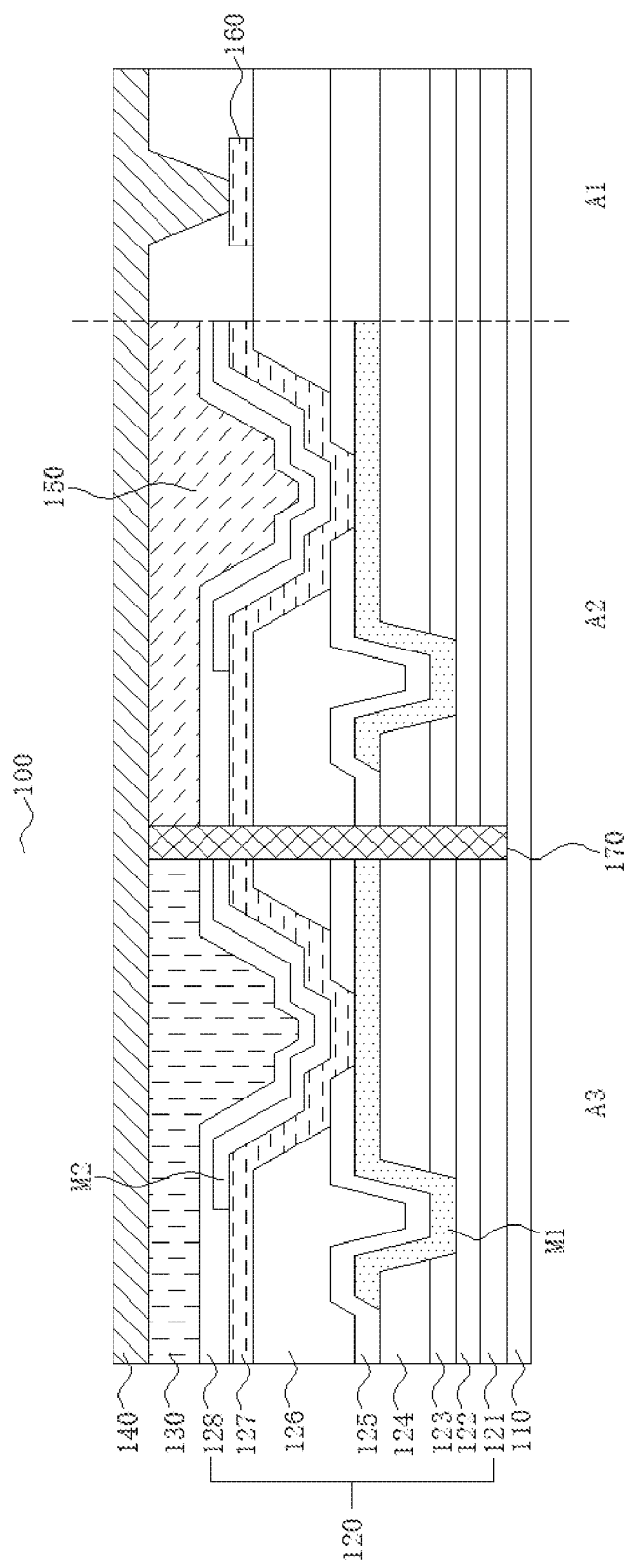
FIG. 1 illustrates a cross-sectional structure of a touch sensing module of a first embodiment of the present disclosure.

The following description of the various embodiments is provided with reference of drawings to illustrate specific embodiments. Directional terms mentioned in the present disclosure, such as upper, lower, front, back, left, right, inside, outside, lateral, etc., are only referring to the direction of the drawing. Therefore, the directional terms used to describe and clarify the present disclosure should not be viewed as limitations of the present disclosure. In the drawing, similar elements are denoted by the same reference numbers.

The following description illustrates the present disclosure with drawings and specific embodiments.

First Embodiment

Figure 2:
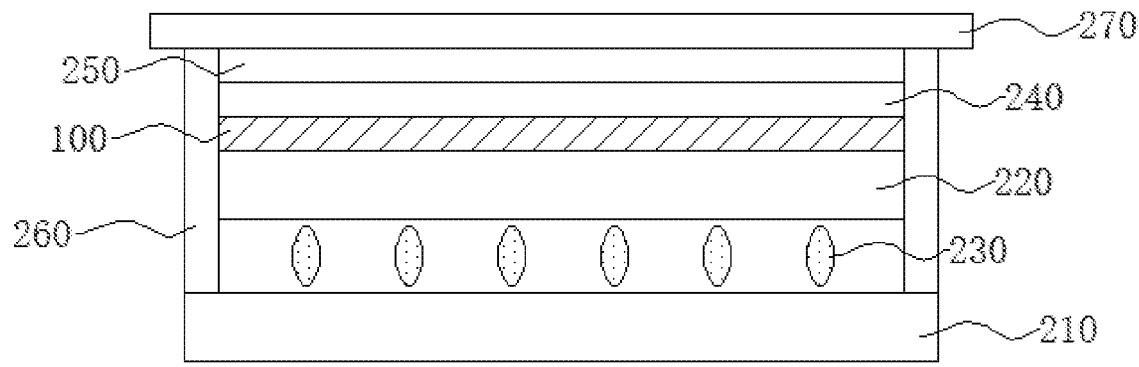
FIG. 2 illustrates a cross-sectional structure of a display panel of the first embodiment of the present disclosure.

The first embodiment of the present disclosure provides a display panel which is illustrated accompanying with FIG. 1 and FIG. 2.

As shown in FIG. 1, it illustrates a cross-sectional structure of a touch sensing module 100 of the embodiment of the present disclosure.

The touch sensing module 100 includes a touch control unit A1, a fingerprint sensing module A2, a vibrating acoustical unit A3, and a common electrode 140. The touch control unit A1 includes a touch control signal line 160. The fingerprint sensing module A2 includes a fingerprint sensing circuit and the first piezoelectric layer 150. The vibrating acoustical unit A3 includes a vibrating acoustical circuit 120 and a second piezoelectric layer 130. The common electrode 140 covers the touch control unit A1, the fingerprint sensing module A2, and the vibrating acoustical unit A3 and penetrates through a passivation protective layer 128 to contact the touch control signal line 160. The common electrode 140 is connected to a flexible circuit board and a driving circuit chip for time-divisionally transmitting a touch control signal, a fingerprint sensing signal, and a vibrating acoustical signal.

As shown in FIG. 1, the touch sensing module 100 includes a base substrate 110. The touch control unit A1, the fingerprint sensing module A2, and the vibrating acoustical unit A3 are all disposed on the base substrate 110. The fingerprint sensing circuit is disposed on the same layer as the vibrating acoustical circuit 120. The vibrating acoustical circuit 120 includes a light-blocking layer 121, a semiconductor layer 122, a gate insulating layer 123, an interlayer dielectric layer 124, a first metal trace M1, an insulating layer 125, a planarization layer 126, a first electrode 127, a second metal trace M2, and the passivation protective layer 128. The first metal trace M1 is connected to the semiconductor layer 122 through a via hole penetrating through the interlayer dielectric layer 124 and the gate insulating layer 123. The first electrode 127 is connected to the first metal wire 125 through a via hole penetrating through the insulating layer 125. The first electrode 127 and the common electrode 140 form a capacitance after being conducted. The alternating voltage makes the second piezoelectric layer 130 generate piezoelectric effects and deform, thereby driving a base substrate near the second piezoelectric layer 130 to vibrate and generate sounds.

Preferably, a material of the second piezoelectric layer 130 includes piezoelectric ceramics. In some embodiments, stacked piezoelectric structure composed of a plurality of piezoelectric ceramics may also be adopted.

Preferably, a material of the first electrode 127 includes one or a combination of multiple metals selected from Ag, Al, Mo, Au, Cr, Ni, Cu, and Pt. In some embodiments, material of the first electrode 127 material of 127 can be chosen from black resin material with conductive properties.

In this embodiment, as shown in FIG. 1, the structure of the fingerprint sensing circuit is the same as the structure of the vibrating acoustical circuit 120. In some embodiments, the vibrating acoustical circuit 120 may share with the fingerprint sensing circuit and details are not described herein again.

Similar to the operation of the vibrating acoustical circuit 120, in the fingerprint sensing circuit, the first electrode 127 and the common electrode 140 form a capacitance after being conducted. The first piezoelectric layer 150 generates a piezoelectric effect under an alternating voltage and generates mechanical vibration to generate ultrasound to achieve ultrasonic fingerprint recognition implemented by the fingerprint sensing module.

Preferably, a material of the first piezoelectric layer 150 includes aluminum nitride AlN, lead zirconate titanate (PZT) or polyvinylidene fluoride (PVDF). In some embodiments, the material of the first piezoelectric layer 150 can also be selected from polymers including polyvinylidene fluoride-trifluoroethylene copolymer P (VDF-TrFE).

Because the vibrating acoustical unit A3 and the fingerprint sensing module A2 both implement functions through the piezoelectric effect, in order to avoid mutual interference between the vibrating acoustical unit A3 and the fingerprint sensing module A2, in this embodiment, a gap 170 is formed between the sensing module A2 and the vibrating acoustical unit A3, and the gap 170 penetrates through a connecting area where the fingerprint sensing circuit is connected to the vibrate acoustical circuit 120, the first piezoelectric layer 150, and the second piezoelectric layer 130 and extends to the common electrode 140. The gap 170 is filled with a sound insulation material for blocking interference between the vibrating acoustical unit A3 and the fingerprint sensing module A2.

As shown in FIG. 2, it illustrates a cross-sectional structure of the display panel 200. The display panel 200 further includes a color film substrate 220 and an array substrate 210 which are disposed oppositely, and a liquid crystal layer 230 is disposed between the color film substrate 220 and the array substrate 210. The color film substrate 220 is provided with a polarizer 240 on a side facing away from the liquid crystal layer 230. The touch sensing module 100 is disposed between the polarizer 240 and the color film substrate 220. When the sound on display unit A3 works, the second piezoelectric layer 130 deforms due to the piezoelectric effect, which drives the color film substrate 200, which is adhered to the second piezoelectric layer 130, to vibrate and generate sounds, thereby the technical effect of sound on display is achieved.

In this embodiment, a protective layer 270 is provided on a side of the polarizer 240 facing away from the color film substrate 220. The protective layer 270 is adhered to the polarizer 240 through an optical adhesive layer coated on a surface of the polarizer 240 for protecting the touch sensing module 100. The color film substrate 220 and the array substrate 210 are also provided with a middle frame 260 on both sides.

Preferably, a material of the protective layer 270 includes glass, sapphire, or a transparent polymer material.

In this embodiment, the color film substrate 220 includes a plurality of pixels arranged in an array. Each touch sensing module 100 including the touch control unit A1, the fingerprint sensing module A2, and the vibrating acoustical unit A3 corresponds to one pixel.

Accompanying with FIG. 2, the display panel 200 provided in the embodiment of the present disclosure is a display panel with an on-cell touch structure. The touch sensing module 100 is disposed between the polarizer 240 and the color film substrate 220. The vibrating acoustical unit A3 and the fingerprint sensing module A2 are integrated in the touch sensing module 100. The common electrode 140 covers the touch control unit A1, the fingerprint sensing module A2, and the vibrating acoustical unit A3 and time-divisionally transmits a touch control signal, a fingerprint sensing signal, and a vibrating acoustical signal to implement sound on display and fingerprint recognition, thereby saving components inside the display panel 200 and holes disposed in the front of the display panel 200. Thus, risks of dust clogging the display panel 200 or dust invasion through handsets of the display panel 200 are reduced, while the screen ratio of the display panel 200 is increased.

Second Embodiment

Figure 3:
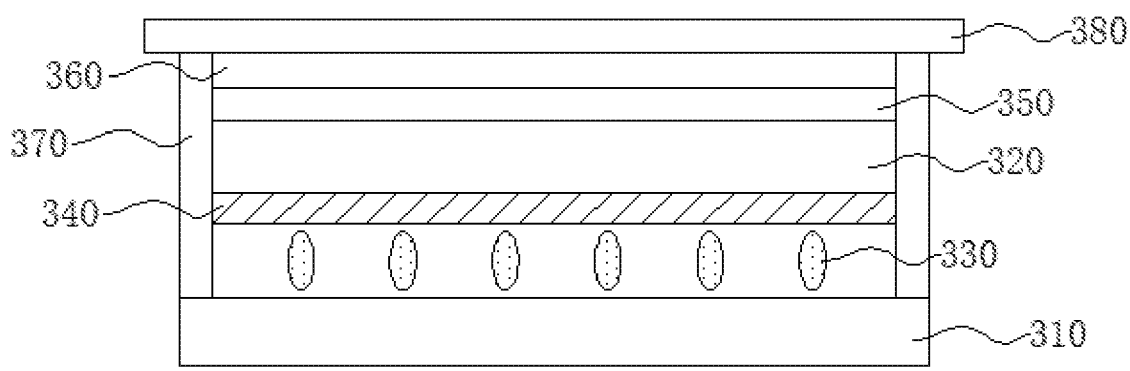
FIG. 3 illustrates a cross-sectional structure of a display panel of a second embodiment of the present disclosure.

The present disclosure provides a display panel which is illustrated with FIG. 3.

As shown in FIG. 3, it is a cross-sectional structure of a display panel 300 of the embodiment of the present disclosure.

The display panel 300 includes a color film substrate 320 and an array substrate 310 which are disposed oppositely, a liquid crystal layer 330 disposed between the color film substrate 320 and the array substrate 310, and a touch sensing module 340. The touch sensing module 340 is disposed on a side of the color film substrate 320 close to the liquid crystal layer 330. When the sound on display unit A3 operates, the second piezoelectric layer deforms due to the piezoelectric effect, which drives the color film substrate 320, which is adhered to the second piezoelectric layer, to vibrate and generate sounds, thereby achieving the technical effect of sound on display.

In the embodiment of the present disclosure, the touch sensing module 340 has the same structure as the touch sensing module 100 provided in the first embodiment and can achieve the same technical effects as the touch sensing module 100, which is not described herein again.

As shown in FIG. 3, the polarizer 350 is provided on a side of the color film substrate 320 facing away from the array substrate 310. The polarizer 350 is adhered to a protective layer 380 by an optical adhesive 360 coated on the surface of the polarizer 350 to protect the touch sensing module 340. A middle frame 370 is also provided on both sides of the color film substrate 320 and the array substrate 310.

Preferably, the material of the protective layer 380 includes glass, sapphire, or a transparent polymer material.

In this embodiment, the color film substrate 320 includes a plurality of pixels arranged in an array. Each touch sensing module 340 including the touch control unit A1, the fingerprint sensing module A2, and the vibrating acoustical unit A3 corresponds to one pixel.

Accompanying with FIG. 3, the display panel 300 provided in the embodiment of the present disclosure is a display panel with an in-cell touch structure. The touch sensing module 340 is disposed between the color film substrate 320 and the liquid crystal layer 330. The vibrating acoustical unit A3 and the fingerprint sensing module A2 are integrated in the touch sensing module 340. The common electrode covers the touch control unit A1, the fingerprint sensing module A2, and the vibrating acoustical unit A3 and time-divisionally transmits the touch control signal, the fingerprint sensing signal, and the vibrating acoustical signal to implement sound on display and fingerprint recognition, thereby saving components inside the display panel 300 and holes disposed in the front of the display panel 300. Thus, the risks of dust clogging the display panel 300 or dust invasion through the handsets of the display panel 300 are reduced, while the screen ratio of the display panel 300 increased.

Third Embodiment

Figure 4:
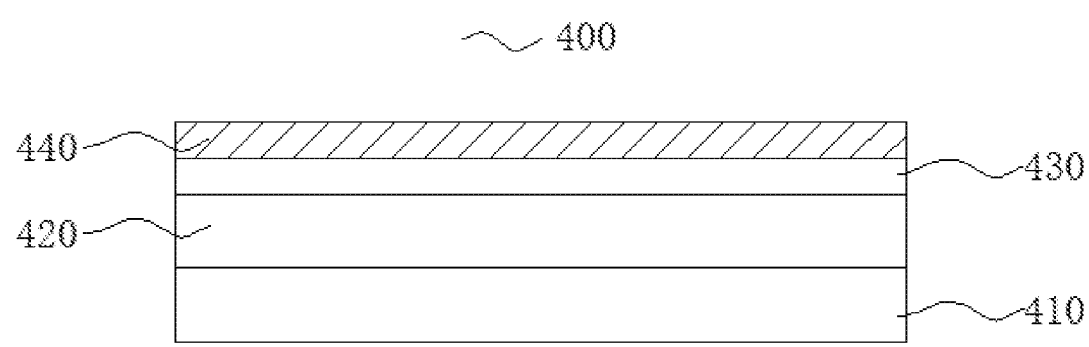
FIG. 4 illustrates a cross-sectional structure of a display panel of a third embodiment of the present disclosure.

The embodiment of the present disclosure provides a display panel which is illustrated accompanying with FIG. 4.

As shown in FIG. 4, it illustrates a cross-sectional view of a display panel 400 of the embodiment of the present disclosure. The display panel 400 includes a base substrate 410, an organic light-emitting diode component layer 420, a packaging layer 430, and a touch sensing module 440. The touch sensing module 440 is disposed on one side of the packaging layer 430 facing away from the organic light-emitting diode component layer 420.

In the embodiment of the present disclosure, the touch sensing module 440 has the same structure as the touch sensing module 100 provided in the first embodiment and can achieve the same technical effects as the touch sensing module 100, which is not described herein again.

Accompanying with FIG. 4, the display panel 400 of the embodiment of the present disclosure is an organic light-emitting diode (OLED) display panel. The touch sensing module 440 is disposed on one side of the packaging layer 430 facing away from the organic light emitting layer diode device layer 420.

The vibrating acoustical unit A3 and the fingerprint sensing module A2 are integrated in the touch sensing module 440. The common electrode covers the touch control unit A1, the fingerprint sensing module A2, and the vibrating acoustical unit A3 and time-divisionally transmits the touch control signal, the fingerprint sensing signal, and the vibrating acoustical signal to achieve sound on display and fingerprint recognition, thereby saving components inside the display panel 400 and holes disposed in the front of the display panel 400. Thus, the risks of dust clogging the display panel 400 or dust invasion through the handsets of the display panel 400 are reduced, while the screen ratio of the display panel 400 increased.

The embodiment of the present disclosure also provides a display device, which includes the display panel as described in the above embodiment. The display device can achieve the same technical effects as the display panel provided in the above embodiment, which is not described here in detail again.

To conclude, although the present disclosure is disclosed as above with the preferred embodiments, the above-mentioned preferred embodiments are not intended to limit the present disclosure. A skilled person in the art can make variations and modifications can be obtained without departing from the aspect and scope of the present disclosure fall in the scope of protection of this disclosure on the basic of the scope defined by the claims.

What is claimed is:

1. A display panel comprising a touch sensing module, wherein the touch sensing module comprises:
    a touch control unit comprising a touch control signal line;
    a fingerprint sensing module comprising a fingerprint sensing circuit and a first piezoelectric layer;
    a vibrating acoustical unit comprising a vibrating acoustical circuit and a second piezoelectric layer; and
    a common electrode, wherein the common electrode covers the touch control unit, the fingerprint sensing module, and the vibrating acoustical unit, and is configured to time-divisionally transmit a touch control signal, a fingerprint sensing signal, and a vibrating acoustical signal.

2. The display panel according to claim 1, wherein a gap is defined between the fingerprint sensing module and the vibrating acoustical unit and is filled with sound insulation material for blocking interference between the vibrating acoustical unit and the fingerprint sensing module.

3. The display panel according to claim 1, wherein the vibrating acoustical circuit comprises a first electrode disposed on one side of the first piezoelectric layer facing away from the common electrode, a passivation protective layer is disposed between the first electrode and the first piezoelectric layer, and the vibrating acoustical circuit and the fingerprint sensing circuit have a same structure and are disposed in a same layer.

4. The display panel according to claim 3, wherein a material of the first electrode is selected from one of Ag, Al, Mo, Au, Cr, Ni, Cu, and Pt or a combination of more than one of Ag, Al, Mo, Au, Cr, Ni, Cu, and Pt.

5. The display panel according to claim 1, wherein the display panel further comprises a color film substrate and an array substrate disposed opposite to each other and a liquid crystal layer disposed between the color film substrate and the array substrate, wherein a polarizer is disposed on one side of the color film substrate facing away from the liquid crystal layer, and the touch sensing module is disposed between the polarizer and the color film substrate.

6. The display panel according to claim 1, wherein the display panel further comprises a color film substrate and an array substrate disposed opposite to each other and a liquid crystal layer disposed between the color film substrate and the array substrate, wherein the touch sensing module is disposed on one side of the color film substrate close to the liquid crystal layer.

7. The display panel according to claim 1, wherein the display panel further comprises a base substrate, an organic light-emitting diode component layer, and a packaging layer, and the touch sensing module is disposed on one side of the packaging layer facing away from the organic light-emitting diode component layer.

8. The display panel according to claim 1, wherein a material of the first piezoelectric layer is selected from aluminum nitride, lead zirconate titanate, or polyvinylidene fluoride.

9. The display panel according to claim 1, wherein a material of the second piezoelectric layer is piezoelectric ceramics.

10. A display device comprising a display panel comprising a touch sensing module, wherein the touch sensing module comprises:
   a touch control unit comprising a touch control signal line;
   a fingerprint sensing module comprising a fingerprint sensing circuit and a first piezoelectric layer;
   a vibrating acoustical unit comprising a vibrating acoustical circuit and a second piezoelectric layer; and
   a common electrode, wherein the common electrode covers the touch control unit, the fingerprint sensing module, and the vibrating acoustical unit, and is configured to time-divisionally transmit a touch control signal, a fingerprint sensing signal, and a vibrating acoustical signal.

11. The display device according to claim 10, wherein a gap is defined between the fingerprint sensing module and the vibrating acoustical unit and is filled with sound insulation material for blocking interference between the vibrating acoustical unit and the fingerprint sensing module.

12. The display device according to claim 10, wherein the vibrating acoustical circuit comprises a first electrode disposed on one side of the a first piezoelectric layer facing away from the common electrode, a passivation protective layer is disposed between the first electrode and the first piezoelectric layer, and the vibrating acoustical circuit and the fingerprint sensing circuit have a same structure and are disposed in a same layer.

13. The display device according to claim 12, wherein a material of the first electrode is selected from one of Ag, Al, Mo, Au, Cr, Ni, Cu, and Pt, or a combination of more than one of Ag, Al, Mo, Au, Cr, Ni, Cu, and Pt.

14. The display device according to claim 10, wherein the display panel further comprises a color film substrate and an array substrate disposed opposite to each other and comprise a liquid crystal layer disposed between the color film substrate and the array substrate, wherein a polarizer is disposed on one side of the color film substrate facing away from the liquid crystal layer, and the touch sensing module is disposed between the polarizer and the color film substrate.

15. The display device according to claim 10, wherein the display panel further comprises a color film substrate and an array substrate opposite to each other and a liquid crystal layer disposed between the color film substrate and the array substrate, wherein the touch sensing module is disposed on one side of the color film substrate close to the liquid crystal layer.

16. The display device according to claim 10, wherein the display panel further comprises a base substrate, an organic light-emitting diode component layer, and a packaging layer, and the touch sensing module is disposed on one side of the packaging layer facing away from the organic light-emitting diode component layer.

17. The display device according to claim 10, wherein a material of the first piezoelectric layer is selected from aluminum nitride, lead zirconate titanate, or polyvinylidene fluoride.

18. The display device according to claim 10, wherein a material of the second piezoelectric layer is piezoelectric ceramics.

19. A display device comprising a display panel comprising a touch sensing module, wherein the touch sensing module comprises:
   a touch control unit comprising a touch control signal line;
   a fingerprint sensing module comprising a fingerprint sensing circuit and a first piezoelectric layer;
   a vibrating acoustical unit comprising a vibrating acoustical circuit and a second piezoelectric layer, wherein the vibrating acoustical circuit and the fingerprint sensing circuit have a same structure and are disposed in a same layer, and the vibrating acoustical circuit comprises a first electrode; and
   a common electrode, wherein the common electrode covers the touch control unit, the fingerprint sensing module, and the vibrating acoustical unit, and is configured to time-divisionally transmit a touch control signal, a fingerprint sensing signal, and a vibrating acoustical signal, and the first electrode disposed on one side of the first piezoelectric layer facing away from the common electrode.

20. The display device according to claim 19, wherein a gap is defined between the fingerprint sensing module and the vibrating acoustical unit and is filled with sound insulation material for blocking interference between the vibrating acoustical unit and the fingerprint sensing module.

* * * * *